United States Patent [19]

Takahashi

[11] Patent Number: 5,218,233
[45] Date of Patent: Jun. 8, 1993

[54] LED LAMP HAVING PARTICULAR LEAD ARRANGEMENT

[75] Inventor: Nozomu Takahashi, Kawasaki, Japan

[73] Assignee: Kabushiki Kaisha Toshiba, Kawasaki, Japan

[21] Appl. No.: 728,376

[22] Filed: Jul. 11, 1991

[30] Foreign Application Priority Data

Jul. 24, 1990 [JP] Japan .................................. 2-195917

[51] Int. Cl.$^5$ ...................... H01L 23/48; H01L 23/12
[52] U.S. Cl. .................................. 257/787; 257/666;
257/81; 257/82; 313/499
[58] Field of Search ....................... 357/70, 72, 17, 19,
357/30; 313/498, 499, 500, 501, 512; 340/782;
362/800

[56] References Cited

U.S. PATENT DOCUMENTS

| | | | |
|---|---|---|---|
| 3,444,440 | 5/1969 | Bell et al. | 357/70 |
| 3,564,352 | 12/1968 | Lehner | 357/70 |
| 4,375,606 | 3/1983 | DiLeo et al. | 357/72 |
| 4,878,107 | 10/1989 | Hopper et al. | 357/72 |

OTHER PUBLICATIONS

Patent Abstracts of Japan, vol. 10, No. 332, (E-453) [2388], Nov. 12, 1986, & JP-A-61-139079, Jun. 26, 1986, I. Matsumoto, "Semiconductor Light-Emitting Display Device".
Patent Abstracts of Japan, vol. 9, No. 10, (E-290) [1733], Jan. 17, 1985, & JP-A-59-159577, Sep. 10, 1984, I. Matsumoto, "Electrode Member for Semiconductor Light Emitting Display and Manufacture Thereof".
Patent Abstracts of Japan, vol. 10, No. 145, (E-407) [2202], May 28, 1986, & JP-A-61-7673, Jan. 14, 1986, S. Tsuru, et al. "Lead Frame".
Patent Abstracts of Japan, vol. 7, No. 158, (E-186) [1303], Jul. 12, 1983, & JP-A-58-66374, Apr. 20, 1983, I. Fukuda, "Light Emitting Diode".

Primary Examiner—Rolf Hille
Assistant Examiner—S. V. Clark
Attorney, Agent, or Firm—Oblon, Spivak, McClelland, Maier & Neustadt

[57] ABSTRACT

The semiconductor of the present invention includes the first lead electrode having a tip portion on which a plurality of semiconductor elements are arranged, a plurality of the second lead electrodes each having a tip portion located close to the tip portion of the first lead electrode, bonding wires for electrically connecting the semiconductor elements and the tip portions of the second lead electrodes with each other, and a mold resin for covering at least the tip ends of the first and second lead electrodes. Further, the invention is characterized in that the second lead electrodes are not arranged in a straight line in the plane common to the end surfaces thereof, and that the second lead electrodes are arranged in a straight line in a plane which is parallel to any of the end surfaces thereof.

8 Claims, 5 Drawing Sheets

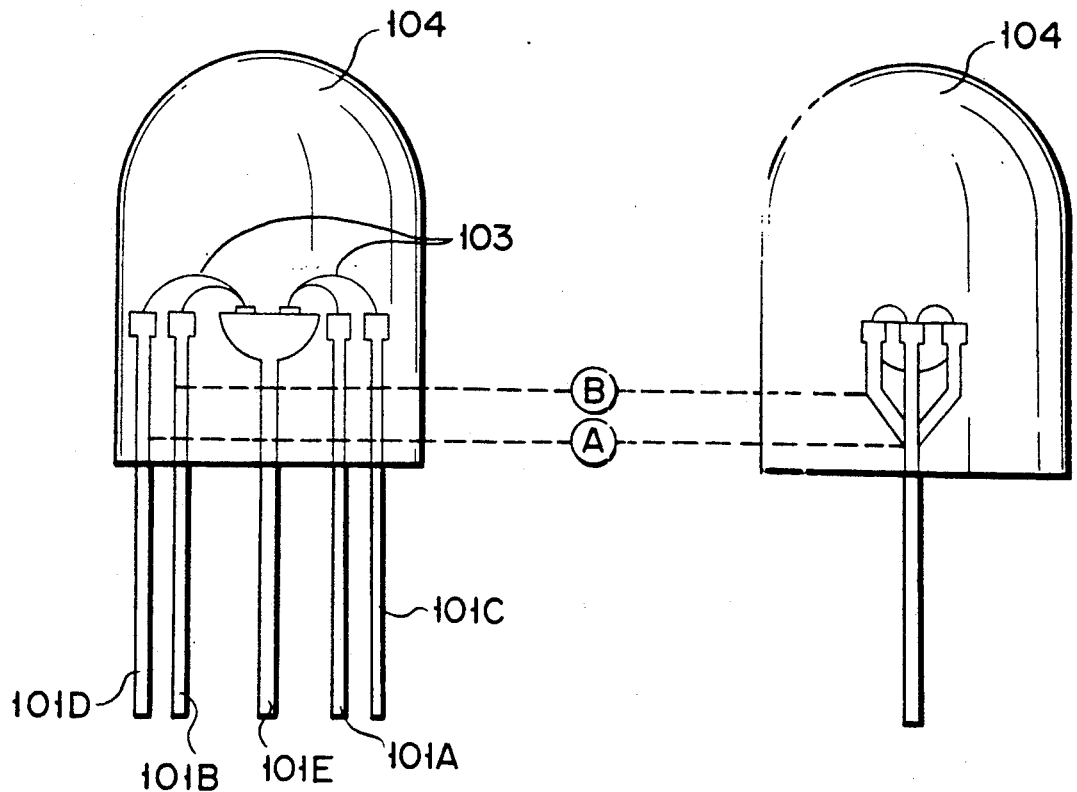
F I G. 3      F I G. 4
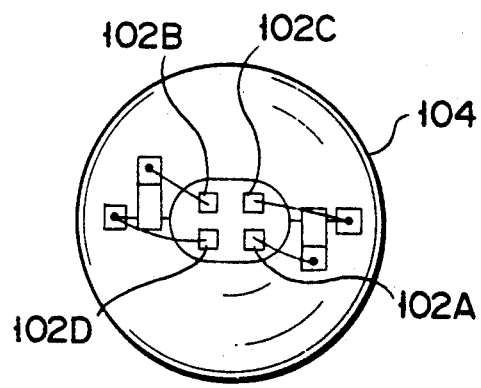
F I G. 5

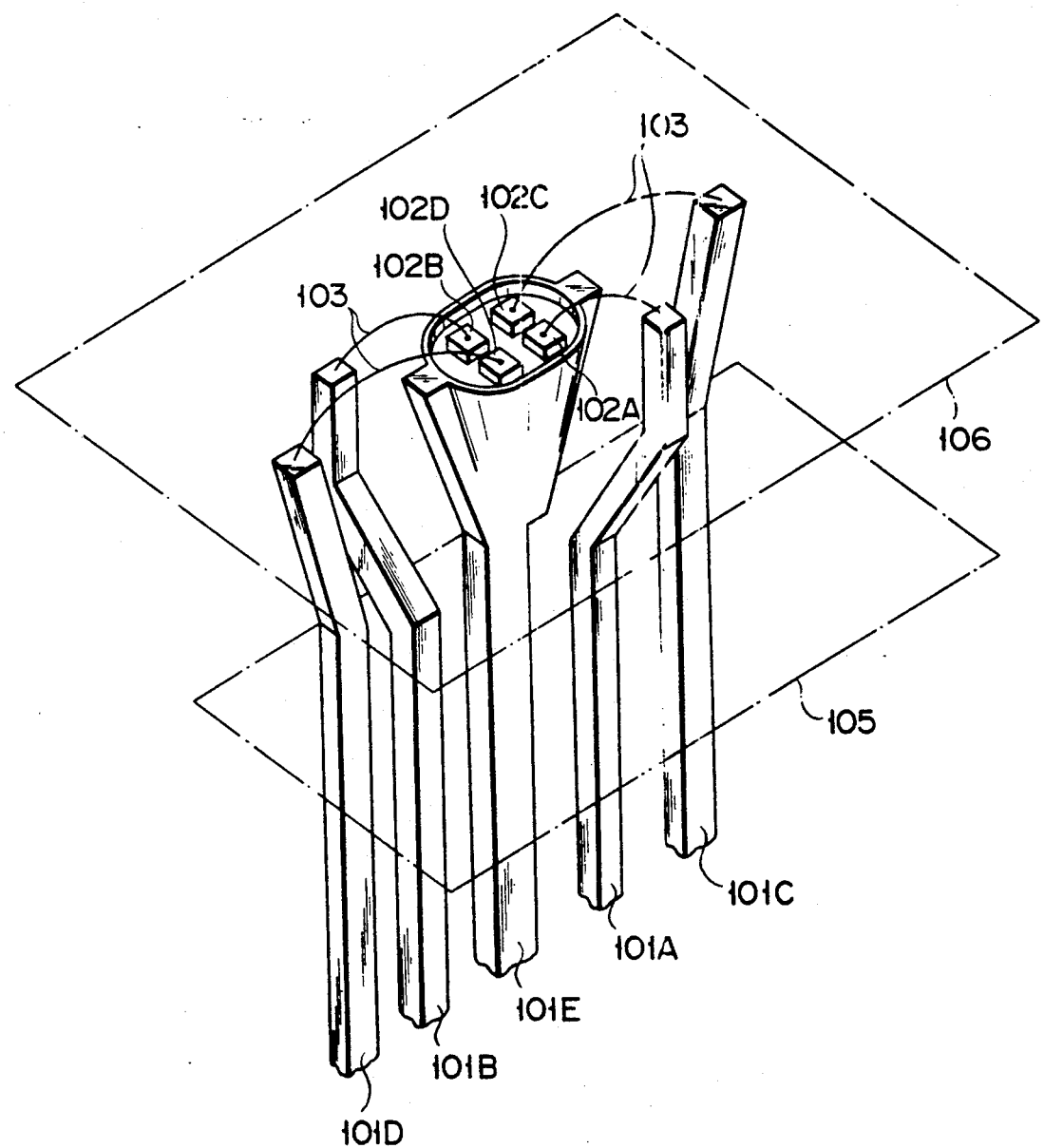
F I G. 6

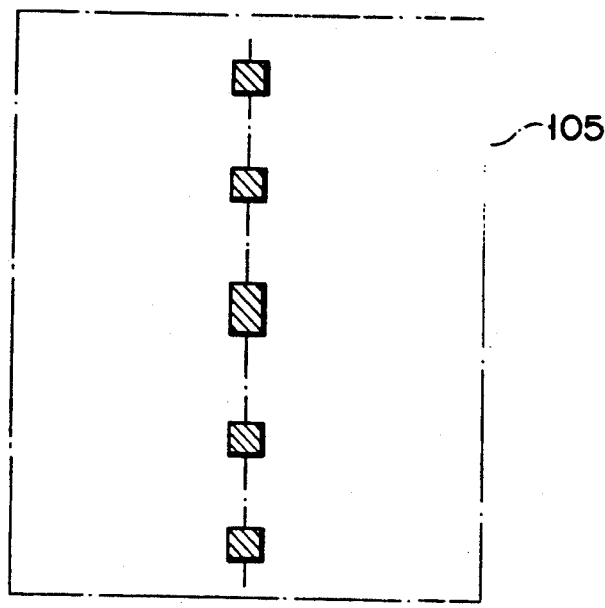
F I G. 7A
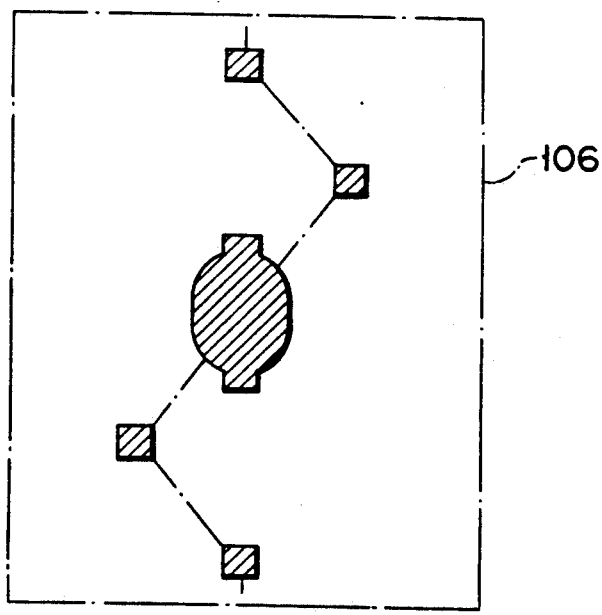
F I G. 7B

LED LAMP HAVING PARTICULAR LEAD ARRANGEMENT

BACKGROUND OF THE INVENTION

1. Field of the Invention

The present invention relates to a remodeled version of an optical semiconductor device in which a plurality of semiconductor elements are arranged on the end surface of the tip portion of a lead electrode, and a connecting area for a bonding wire, i.e. a bonding area, is formed on the end surface of the tip portion of each of other lead electrodes.

2. Description of the Related Art

FIGS. 1 and 2 show conventional LED lamps, which are a type of optical semiconductor device in which a plurality of semiconductor elements are arranged on the end surface of the tip portion of a lead electrode, and a bonding area is formed on the end surface of the tip portion of each of other lead electrodes.

The LED lamp shown in FIG. 1 includes three lead electrodes. One is a mount-use lead electrode 501 on the end surface of the tip portion of which a plurality of semiconductor elements, i.e. LED chips, are arranged, and the other two are bond-use lead electrodes 502 on the end surface of the tip portion of each of which a bonding area is formed. The mount-use lead electrode 501 is provided between the bond-use lead electrodes 502. Two LED chips 503 are arranged on the end surface of the tip portion of the mount-use lead electrode 501. Each of the LED chips 503 is connected to each of the bond-use lead electrodes 504 via a bonding wire 504. The bond-use lead electrodes 502 are arranged so that they locate both sides of the mount-use lead electrode at the angle of 180° with respect to each other. With this structure, the bonding wires 504 are not in contact with each other, and the two LED chips 503 are separately operated.

On the other hand, the LED lamp shown in FIG. 2 includes four lead electrodes. One is a mount-use lead electrode 501 on the end surface of the tip portion of which a plurality of LED chips are arranged, and the other three are bond-use lead electrodes 502 on the end surface of the tip portion of each of which a bonding area is formed. Three LED chips are arranged on the end surface of the tip portion of the mount-use lead electrode 501, and each of the LED chips 503 is connected to each of the bond-use lead electrodes 502 via a bonding wire 504. The three bond-use lead electrodes 502 of this LED lamp are arranged so that the end surfaces of the tip portions thereof make a straight line. With this structure, the bonding wires 504 locate inevitably very close to each other, and sometimes come cross with each other.

SUMMARY OF THE INVENTION

The present invention is directed to solving the above-mentioned problem, and the purpose thereof is to provide a semiconductor device of the above-described type, in which a plurality of bonding wires do not contact or close with each other.

In order to achieve the above purpose, the semiconductor device of the present invention comprises the first lead electrode having a tip portion on an end surface of the tip portion a plurality of semiconductor elements being arranged, a plurality of second lead electrodes each having a tip portion located close to the tip portion of the first lead electrode, bonding wires for electrically connecting the semiconductor elements to the tip portions of the second lead electrodes, and a mold resin for covering at least the tip portions of said first and second lead electrodes, said second lead electrodes being arranged such that the end surfaces of the tip ends thereof are not arranged in a straight line.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a front view of a semiconductor device according to an embodiment of the present invention;

FIG. 4 is a side view of the semiconductor device according to the embodiment;

FIG. 5 is a top view of the semiconductor device according to the embodiment;

FIG. 6 is an overall view of the semiconductor device according to the embodiment;

FIGS. 7A and 7B depict lead electrodes in the planes 105 and 106 shown in FIG. 6, respectively.

DETAILED DESCRIPTION OF THE PREFERRED EMBODIMENTS

Figure 1:
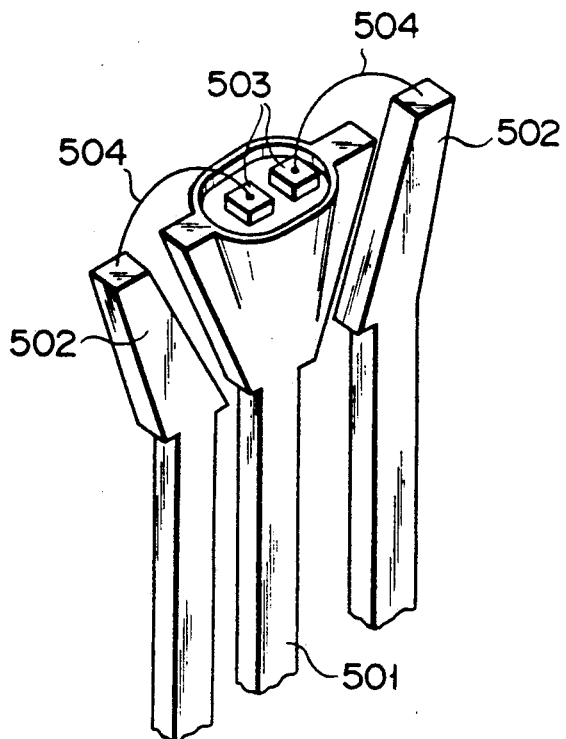
FIGS. 1 and 2 show the appearances of conventional semiconductor devices.
Figure 2:
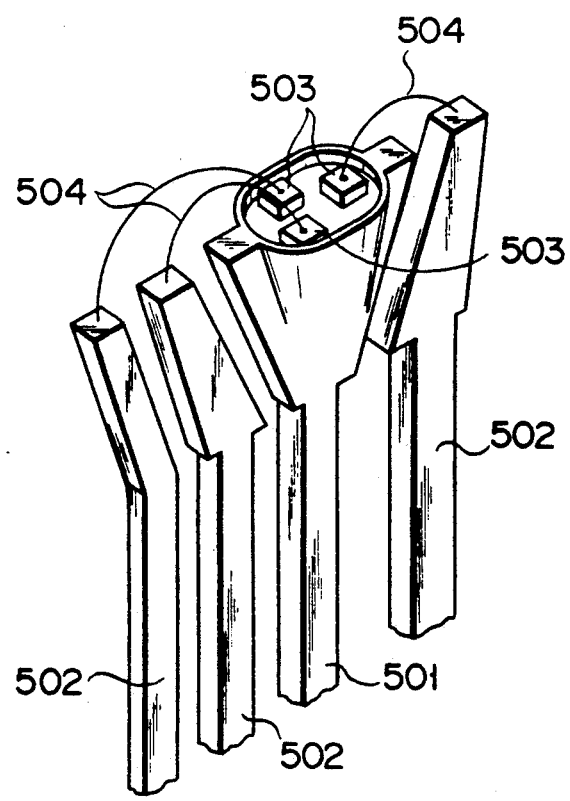

An embodiment of the present invention will now be described in detail with reference to accompanying drawings.

FIGS. 3, 4, and 5 show an LED lamp according to an embodiment of the present invention, and are front, side, and top views of the LED lamp, respectively.

As can be seen in FIGS. 3-5, the LED lamp includes five lead electrodes 101A-101E. Of all the lead electrodes, one located at the center is a mount-use lead electrode 101E on the end surface of the tip portion of which four LED chips 102A-102D are arranged. The other four lead electrodes are bond-use lead electrodes 101A-101D on the end surface of the tip portion of each of which a connecting portion for a bonding wire is formed. The LED chips 102A-102D are connected to the bond-use lead electrodes 101A-101D, respectively, via bonding wires 103. The proximal end section of the lead electrodes 101A-101E group is sealed by a mold resin 104.

In the meantime, the mount-use lead electrode 101E and the bond-use lead electrodes 101A-101E constitute, for example, a lead frame. Therefore, as can be seen in FIGS. 6 and 7, the lead electrodes 101A-101E are aligned in a plane parallel to the end surfaces of the tip portions, for example, the plane denoted by reference numeral 105 in each of FIGS. 6 and 7A. However, the LED lamp of the present invention is characterized in that, of the planes parallel with the end surfaces of the tip portion, there are some on which a plurality of lead electrodes are not aligned. For example, the lead electrodes 101A–101E are not aligned at least in the parallel planes located near the tip portion, as of the planes denoted by numeral reference 106 in FIGS. 6 and 7.

With this structure, the bond-use lead electrodes 101A–101D can be connected to the LED chips 102A–102D without the bonding wires 103 being brought into contact with each other.

Such an LED lamp can be manufactured by bending bond-use lead electrodes 102 which are next to the mount-use lead electrode 101E at bending points A and B located in the mold resin 104, as can be seen in FIGS. 3 and 4 under the condition that the end surface of the tip portion of each of the bond-use lead electrodes 101A–101D becomes parallel with that of the mount-use lead electrode 101E (note that the end surface of the mount-use lead electrode 101E has a plate-like shape, on which the LED chips 102A–102D are arranged).

Figure 8:
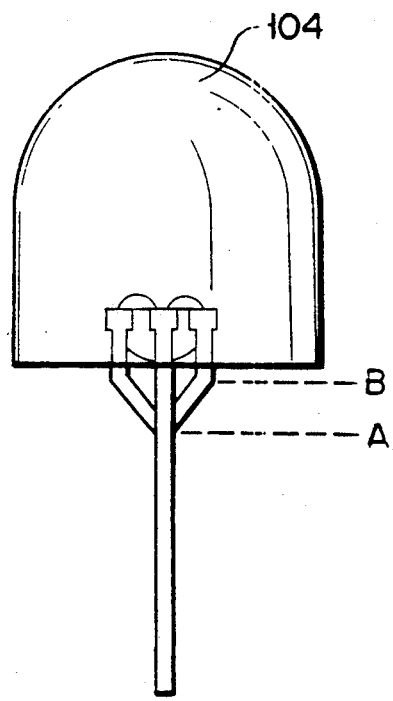
FIGS. 8 and 9 are side views showing semiconductor devices according to other embodiments of the present invention.

FIG. 8 shows an LED lamp according to another embodiment of the present invention This LED lamp includes bond-use lead electrodes 101A and 101B which are bent at bending points A and B both located outside a mold resin 104.

Figure 9:
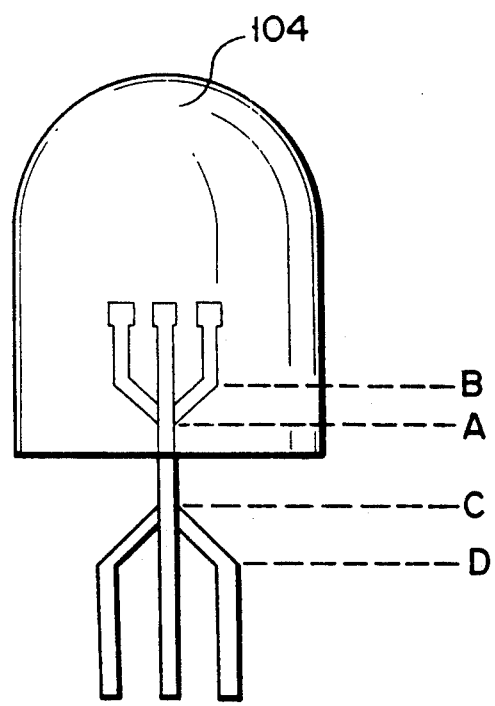

FIG. 9 shows an LED lamp according to another embodiment of the present invention. This LED lamp is of a type wherein section of lead electrodes located outside a mold resin 104, i.e. outer leads, are not aligned on a plane which is parallel to the end surface of the tip portion of each of the lead electrodes. Such an LED lamp can be manufactured, for example, by bending lead electrodes 101A and 101B at bending points C and D by a lead forming method. Thus, an adjustment of pitch of the lead electrodes 101A–101E can be easily performed.

As described, according to the present invention, the tip portions of the bond-use lead electrodes 101A–101D can be two-dimensionally arranged. Therefore, even if three or more LED chips are mounted on the mount-use lead electrode, large loops as well as crossings of bonding wires can be avoided. Thus, the bonding process can be easily performed.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A semiconductor device comprising:
   a first lead electrode having a tip portion, wherein on and end surface of the tip portion a plurality of semiconductor elements are arranged;
   a plurality of second lead electrodes each having a tip portion located close to the tip portion of said first lead electrode;
   bonding wires for electrically connecting said semiconductor elements to the tip portions of said second lead electrodes; and
   a mold resin for covering at least the tip portions of said first and second lead electrodes,
   said second lead electrodes being arranged such that the end surfaces of the tip ends thereof are not arranged in a straight line,
   wherein the sections of said second lead electrodes which are located outside said mold resin are not arranged in a straight line on a plane parallel to any one of the end surfaces of the tip portions thereof.

2. A semiconductor device according to claim 1, wherein said first lead electrode has three or more semiconductor elements on the end surface of the tip portion thereof.

3. A semiconductor device according to claim 1, wherein said second lead electrodes are arranged in a straight line on a plane parallel to any one of the end surfaces of the tip portions thereof.

4. A semiconductor device according to claim 1, wherein sections of said second lead electrodes which are located outside said mold resin are arranged in a straight line on a plane parallel to any one of the end surfaces of the tip portions thereof.

5. A semiconductor device comprising:
   a first lead electrode having a tip portion wherein on an end surface of the tip portion a plurality of semiconductor elements are arranged;
   a plurality of second lead electrodes each having a tip portion located close to the tip portion of said first lead electrode;
   bonding wires for electrically connecting said semiconductor elements to the tip portions of said second lead electrodes; and
   a mold resin for covering at least the tip portions of said first and second lead electrodes,
   said second lead electrodes being arranged such that the end surfaces of the tip ends thereof are not arranged in a straight line,
   wherein sections of said second lead electrodes which are located inside said mold resin are not arranged in a straight line on a plane parallel to any one of the end surfaces of the tip portions thereof.

6. A semiconductor device according to claim 5, wherein said first lead electrode has three or more semiconductor elements on the end surface of the tip portion thereof.

7. A semiconductor device according to claim 5, wherein said second lead electrodes are arranged in a straight line on a plane parallel to any one of the end surfaces of the tip portions thereof.

8. A semiconductor device according to claim 5, wherein sections of said second lead electrodes which are located outside said mold resin are arranged in a straight line on a plane parallel to any one of the end surfaces of the tip portions thereof.

* * * * *